(12) United States Patent
Singh et al.

(10) Patent No.: US 8,525,139 B2
(45) Date of Patent: *Sep. 3, 2013

(54) METHOD AND APPARATUS OF HALOGEN REMOVAL

(75) Inventors: Harmeet Singh, Fremont, CA (US);
Sanket Sant, Fremont, CA (US);
Shang-I Chou, San Jose, CA (US);
Vahid Vahedi, Oakland, CA (US);
Raphael Casaes, Alameda, CA (US);
Seetharaman Ramachandran, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 518 days.

This patent is subject to a terminal disclaimer.

(21) Appl. No.: 12/908,258

(22) Filed: Oct. 20, 2010

(65) Prior Publication Data
US 2011/0097902 A1 Apr. 28, 2011

Related U.S. Application Data

(63) Continuation-in-part of application No. 12/606,528, filed on Oct. 27, 2009, now Pat. No. 8,232,538.

(51) Int. Cl.
*A61N 5/06* (2006.01)
*C23F 1/00* (2006.01)
*H01L 21/3065* (2006.01)
*H01L 21/26* (2006.01)

(52) U.S. Cl.
USPC .............. 250/504 R; 250/459.1; 250/461.1; 250/492.1; 156/345.31; 156/345.5; 216/66; 257/E21.218

(58) Field of Classification Search
USPC ......... 250/458.1, 459.1, 461.1, 492.1, 504 R; 216/58, 60, 63, 65, 66; 156/345.31, 345.32, 156/345.5; 257/E21.218
See application file for complete search history.

(56) References Cited

U.S. PATENT DOCUMENTS 5,217,559 A 6/1993 Moslehi et al.
5,981,399 A * 11/1999 Kawamura et al. ........... 438/715
(Continued)

FOREIGN PATENT DOCUMENTS

EP 1 508 385 A1 2/2005
JP 61-39524 2/1986
(Continued)

OTHER PUBLICATIONS

Office Action dated Dec. 5, 2011 from U.S. Appl. No. 12/606,528.
(Continued)

*Primary Examiner* — Bernard E Souw
(74) *Attorney, Agent, or Firm* — Beyer Law Group LLP

(57) ABSTRACT

A wafer is provided into an entrance load lock chamber. A vacuum is created in the entrance load lock chamber. The wafer is transported to a processing tool. The wafer is processed in a process chamber to provide a processed wafer, wherein the processing forms halogen residue. A degas step is provided in the process chamber after processing the wafer. The processed wafer is transferred into a degas chamber. The processed wafer is treated in the degas chamber with UV light and a flow of gas comprising at least one of ozone, oxygen, or $H_2O$. The flow of gas is stopped. The UV light is stopped. The processed wafer is removed from the degas chamber.

20 Claims, 9 Drawing Sheets

(56) References Cited

U.S. PATENT DOCUMENTS

| | | | |
|---|---|---|---|
| 6,232,248 B1* | 5/2001 | Shinriki et al. | 438/785 |
| 6,661,075 B2 | 12/2003 | Varhue et al. | |
| 6,734,120 B1 | 5/2004 | Berry et al. | |
| 6,848,455 B1 | 2/2005 | Shrinivasan et al. | |
| 7,118,852 B2 | 10/2006 | Purdum | |
| 7,265,382 B2 | 9/2007 | Lymberopoulos et al. | |
| 7,396,480 B2 | 7/2008 | Kao et al. | |
| 7,514,015 B2 | 4/2009 | Elliott et al. | |
| 7,843,632 B2 | 11/2010 | Bowering | |
| 8,232,538 B2* | 7/2012 | Sant et al. | 250/504 R |
| 2002/0114880 A1 | 8/2002 | Dreistein et al. | |
| 2002/0170671 A1 | 11/2002 | Matsushita et al. | |
| 2003/0070690 A1 | 4/2003 | Danese | |
| 2003/0192577 A1* | 10/2003 | Thakur et al. | 134/146 |
| 2004/0045578 A1 | 3/2004 | Jackson | |
| 2004/0111339 A1 | 6/2004 | Wehrung et al. | |
| 2004/0154743 A1* | 8/2004 | Savas et al. | 156/345.5 |
| 2004/0238122 A1* | 12/2004 | Ishizawa et al. | 156/345.31 |
| 2005/0098264 A1 | 5/2005 | Wolf et al. | |
| 2005/0218481 A1* | 10/2005 | Lee et al. | 257/642 |
| 2005/0221606 A1* | 10/2005 | Lee et al. | 438/624 |
| 2005/0223989 A1* | 10/2005 | Lee et al. | 118/722 |
| 2007/0107845 A1* | 5/2007 | Ishizawa et al. | 156/345.32 |
| 2008/0230096 A1* | 9/2008 | Kawamura et al. | 134/90 |
| 2008/0254619 A1 | 10/2008 | Lin et al. | |
| 2011/0095207 A1 | 4/2011 | Sant et al. | |

FOREIGN PATENT DOCUMENTS

| | | |
|---|---|---|
| JP | 1-189122 | 7/1989 |
| JP | 1-272120 | 10/1989 |
| JP | 6-063379 | 3/1994 |
| JP | 7-66159 | 3/1995 |
| KR | 10-1999-0033654 | 5/1999 |

OTHER PUBLICATIONS

Notice of Allowance dated Mar. 30, 2012 from U.S. Appl. No. 12/606,528.
International Search Report dated Jun. 3, 2011 from International Application No. PCT/US2010/053858.
Written Opinion dated Jun. 3, 2011 from International Application No. PCT/US2010/053858.
Office Action dated Jun. 22, 2011 from U.S. Appl. No. 12/606,528.

* cited by examiner

METHOD AND APPARATUS OF HALOGEN REMOVAL

CROSS REFERENCE TO RELATED APPLICATIONS

This application is a continuation-in-part and claims priority under 35 U.S.C. §120 to U.S. patent application Ser. No. 12/606,528 entitled "Method and Apparatus of Halogen Removal Using Optimal Ozone and UV Exposure," by Sant et al. filed Oct. 27, 2009, which is hereby incorporated by reference.

BACKGROUND OF THE INVENTION

1. Field of the Invention

The invention relates to semiconductor devices. More specifically, the invention relates to the production of semiconductor devices which require processing wafers where halogens are used during the processing.

2. Description of the Related Art

During the formation of semiconductor devices, wafers are processed in a processing tool where they are subject to processes that may result in residual process gases, segments and byproducts being left on the surface of the wafers. These residues may include, but are not limited to halogen-containing species.

One method of removing the residue is by treating the processed wafers in a downstream stripper with a microwave or inductively coupled plasma source. A downstream stripper module may be placed as one module in a processing tool. The processed wafer would then be placed in the downstream stripper module where the halides on the surface of the processed wafer would be removed/reduced. However, this stripping process occurs after processing within the vacuum of the processing tool. Thus the downstream stripper module takes up one of the valuable spots in the processing tool. Using this spot in the processing tool for the downstream stripper module means that the spot cannot be used for another process chamber which results in a decrease in wafer processing throughput.

SUMMARY OF THE INVENTION

To achieve the foregoing and in accordance with the purpose of the present invention, a method for processing a wafer is provided. A wafer is provided into an entrance load lock chamber. A vacuum is created in the entrance load lock chamber. The wafer is transported from the entrance load lock chamber to a processing tool. The wafer is processed in a process chamber in the processing tool to provide a processed wafer, wherein the processing forms halogen residue on the wafer. A degas step is provided to the wafer in the process chamber after processing the wafer. The processed wafer is transferred into a degas chamber, wherein a vacuum is maintained in the degas chamber. The processed wafer is treated in the degas chamber with UV light and a flow of gas comprising at least one of ozone, oxygen, or $H_2O$. The flow of gas is stopped. The UV light is stopped. The processed wafer is removed from the degas chamber.

A method for processing a wafer is provided. A wafer is provided into an entrance load lock chamber. A vacuum is created in the entrance load lock chamber. The wafer is transported from the entrance load lock chamber to a processing tool. The wafer is processed in a process chamber in the processing tool to provide a processed wafer, wherein the processing forms halogen residue on the wafer. The processed wafer is transferred into a degas chamber. The processed wafer is treated in the degas chamber with UV light and a flow of gas comprising at least one of ozone, oxygen, or $H_2O$. The flow of gas is stopped. The UV light is stopped. The processed wafer is removed from the degas chamber.

In another manifestation of the invention, a method for processing a silicon wafer is provided. The silicon wafer is provided into an entrance load lock chamber. A vacuum is created in the entrance load lock chamber. The wafer is transported from the entrance load lock chamber to a processing tool. An etch of the wafer is performed. A fluorine containing wafer process is performed, which leaves a halogen residue on the wafer. A degas step is provided to the wafer in the process chamber wherein the degas step removes at least some of the halogen residue, wherein the providing a degas step to the wafer in the process chamber, comprises providing a halogen free gas of at least 5% oxygen and forming a plasma from the gas of at least 5% oxygen. The wafer is transferred into a degas chamber, wherein a vacuum is maintained in the degas chamber. The processed wafer is treated in the degas chamber with UV light and a flow of gas comprising at least one of ozone, oxygen, or $H_2O$. The flow of gas is stopped. The UV light is stopped. The processed wafer is removed from the degas chamber.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
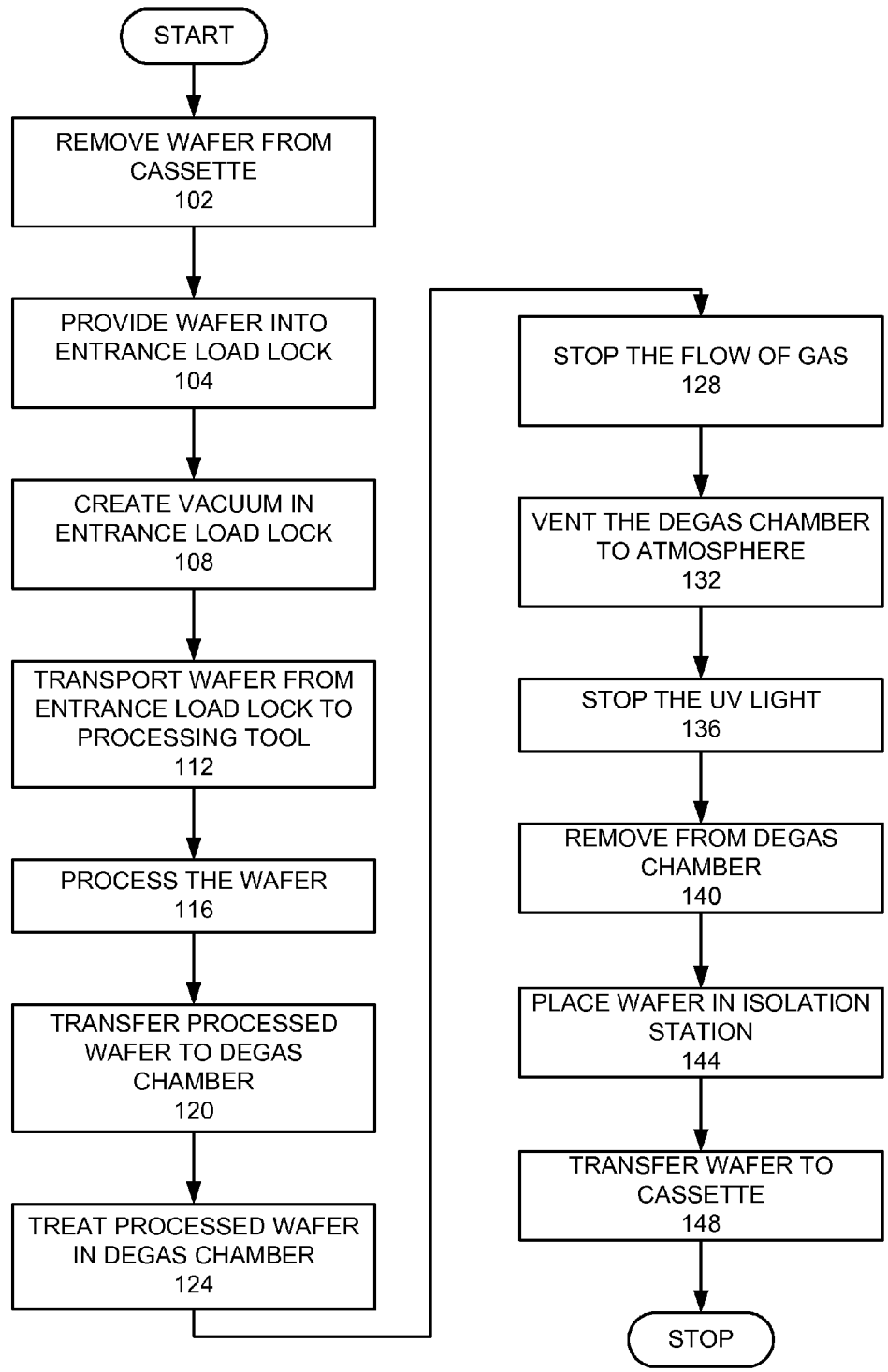
FIG. 1 is a flow chart of an embodiment of the invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

When wafers are processed during the production of semiconductor devices, the wafers are often left with halogen residue as a result of the processing. When the wafers containing the residue are returned to atmosphere, the residues may react with the moisture in the atmosphere causing contamination. There are three main types of contamination that may be caused by the residue: 1) self contamination, 2) cross contamination and 3) equipment contamination.

Self contamination may result when the residue on the wafer reacts with the atmosphere and causes damage to the wafer itself. For example, condensation on the wafer can result in crystalline defects, mask erosion or pattern collapse.

Cross contamination may result when a wafer containing residue is placed in close proximity to other wafers, including unprocessed wafers. For example, this could occur when the processed wafer and unprocessed wafer are close as the processed wafer is being put in the load lock for return to the cassette in atmosphere and the unprocessed wafer is being removed from the load lock to be processed. An additional example is when the processed wafer is returned to a cassette containing many unprocessed wafers. During these times of close proximity, the residue from the processed wafers may migrate to the unprocessed wafers, thus contaminating the unprocessed wafers. This cross contamination may cause defects in the unprocessed wafers when they are subsequently processed. For example, the contamination may cause micromasking defects.

Equipment contamination may result when the wafer with residue reaches the atmosphere and the residue reacts with the moisture in the atmosphere. This reaction may cause acidic outgassing which may transfer to wafer handling equipment, for example the robotic arms used to transfer the wafers. The acidic nature of the contaminant may then cause corrosive damage over time.

A method of reducing or eliminating the contamination from the halogen residue is needed that does not decrease the wafer processing throughput and that does not require the high temperatures used in the downstream stripper module. Some wafers may be made of materials that cannot withstand the high temperatures used in the downstream stripper module, often 200° C. to 400° C. For example, wafers using amorphous carbon would simply burn up if subjected to the temperatures required in the downstream stripper.

FIG. 1 is a high level flow chart of an embodiment of the invention. An unprocessed wafer typically starts outside of the processing tool in normal atmosphere in a cassette that may hold a plurality of wafers. In order to be processed, it must be moved into the vacuum of the processing tool. In this embodiment, the wafer is removed from the cassette (step 102) and moved into an entrance load lock (step 104). The entrance load lock is closed and a vacuum is formed in the entrance load lock (step 108). Once the vacuum has been established in the entrance load lock, the door to the vacuum of the processing tool is opened and the wafer is transferred from the entrance load lock to a processing tool (step 112) where the wafer is processed (step 116). The processing may include having an etch mask applied, being etched or stripping an etch mask, for example. The processing may actually include multiple processes that may require the use of one or multiple processing chambers within the processing tool. The processed wafer is now transferred into the degas chamber (step 120). The degas chamber is then sealed and now contains a vacuum. The wafer is treated with UV light and a gas mixture to remove the halide residue (step 124). The gas mixture comprises at least one of ozone, oxygen, or H2O. While the gas mixture is flowing over the processed wafer, it is also being pumped out of the degas chamber. After the prescribed treatment time, the flow of gas is stopped (step 128), the degas chamber is vented to atmosphere (step 132) and the UV light is stopped (step 136). Once the pressure in the degas chamber has equalized with the atmosphere outside the degas chamber, the treated wafer is removed from the degas chamber (step 140). The treated wafer may then be placed in the isolation station (step 144) for a period of time to allow any remaining residue to dissipate. The treated wafer may then be transferred to a cassette (step 148).

An embodiment of the degas load lock station includes a number of components described in detail below.

Figure 2:
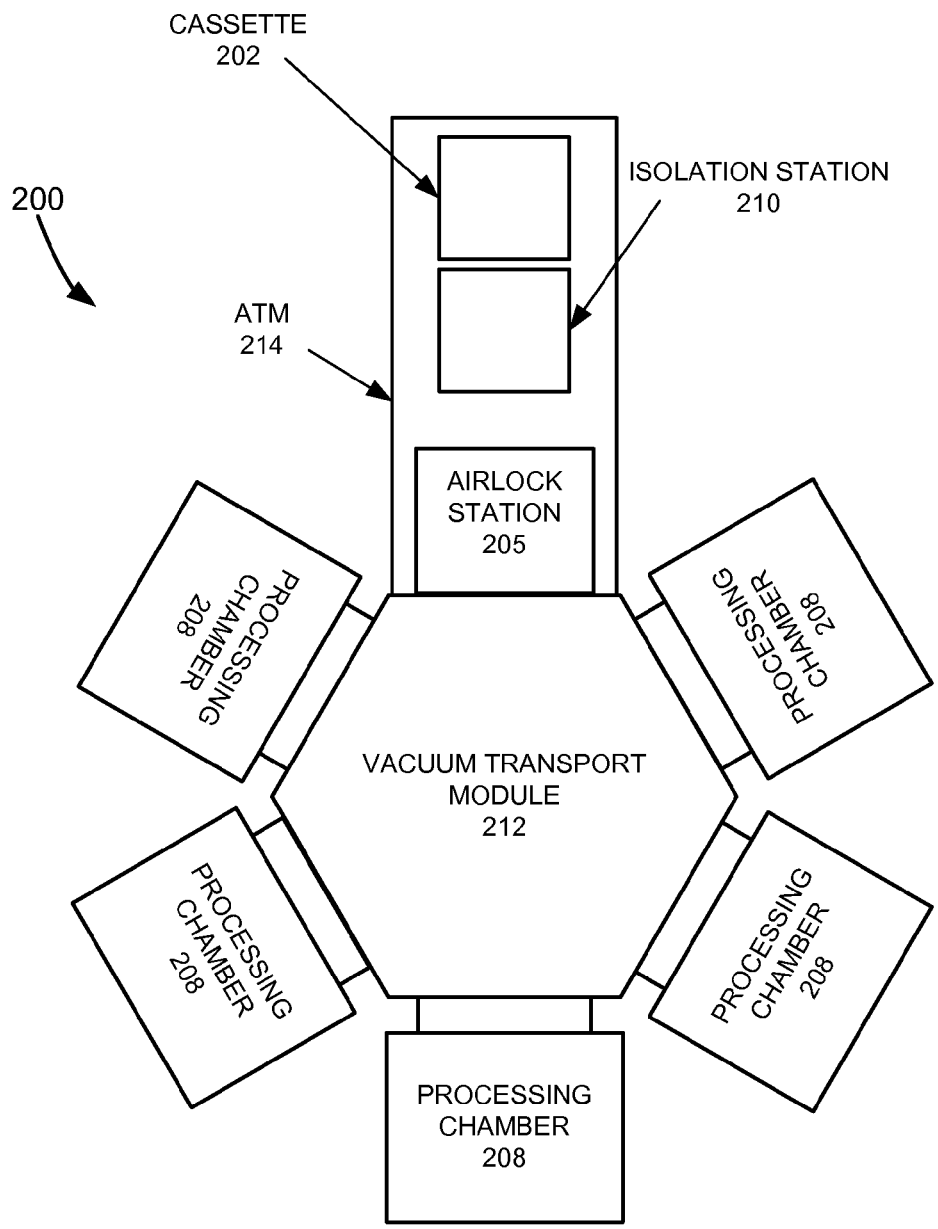
FIG. 2 is a schematic view of a system including an embodiment of the invention

FIG. 2 is a top view of a processing tool 200 and includes components of an embodiment of the invention. A cassette 202 houses the unprocessed wafers before they are processed and then holds the treated wafers once all processing in the processing tool 200 and treating in a degas chamber is completed. The cassette 202 can hold many wafers, often as many as 25. An airlock station 205 represents a set of devices that operate to transfer the wafer back and forth between the atmosphere of an atmosphere transport module (ATM) 214 and the vacuum of a vacuum transport module (VTM) 212. The VTM 212 is part of the processing tool and connects to a plurality of processing chambers 208. There may be different types of processing chambers 208. For example, there may be different processing chambers 208 for each of the following: applying an etch mask, etching, or stripping an etch mask. Alternatively, there may be two or more of the same type of processing chamber 208, in order to help increase throughput.

Figure 3:
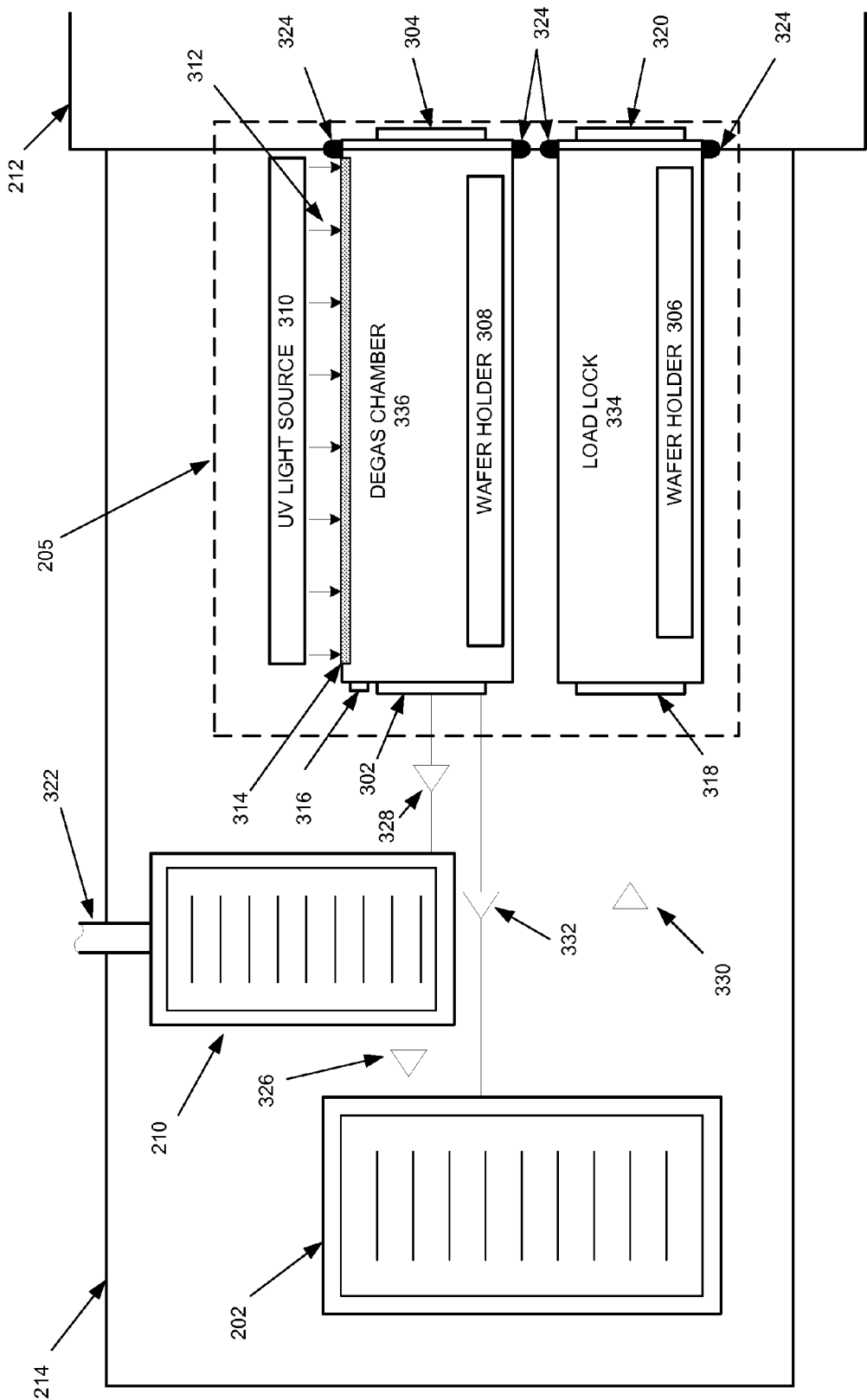
FIG. 3 is a schematic view of an atmosphere transport module with an isolation station and cassette.

FIG. 3 shows a side view of the ATM 214 together with an isolation station 210 and the cassette 202. The airlock station 205 is shown in more detail including the degas chamber 336 and the entrance load lock 334. The entrance load lock 334 has a door to atmosphere 318, a door to vacuum 320, a wafer holder 306, a vent (not shown) and an evacuation means (not shown). The degas chamber 336 and the entrance load lock 334 must be attached to the VTM 212 in a manner that maintains the vacuum in the VTM 212. Therefore, there are vacuum seals 324 at the points where VTM 212 meets the degas chamber 336 and load lock 334 in order to prevent atmosphere from seeping into the VTM 212. While FIG. 3 shows the entrance load lock 334 and the degas chamber 336 as separate structures, it is possible that they may be separate pieces joined together or be machined as one piece. An isolation station 210 holds a plurality of treated wafers to allow any remaining residue to dissipate. The isolation station 210 is preferably made of non-corrosive material to lessen any damage done by any equipment contamination. The isolation station 210 has an exhaust 322 that helps to pull any remaining residue away from the wafers by pumping air out of the isolation station 210.

Figure 4:
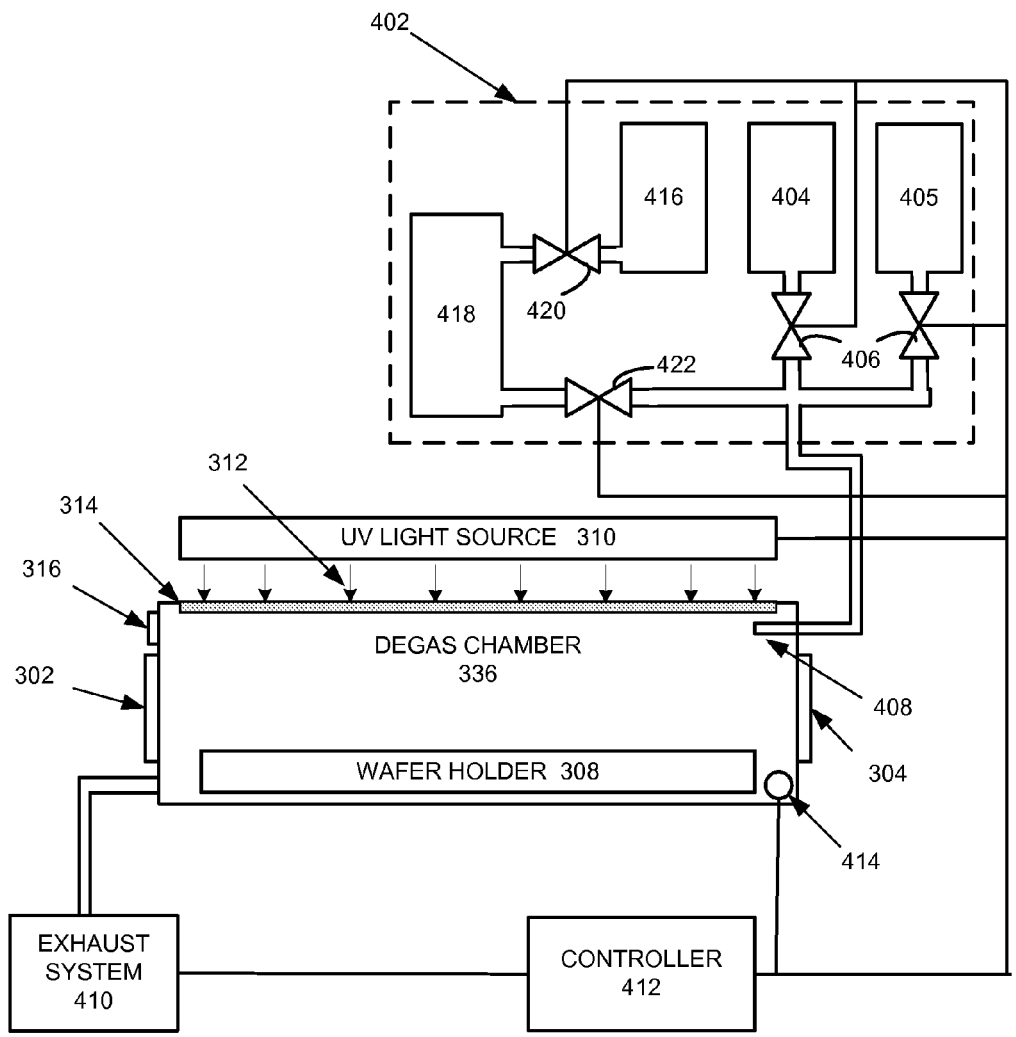
FIG. 4 is a schematic view of an embodiment of a degas chamber and related components.

FIG. 4 shows a more detailed exemplary degas chamber together with related components. The degas chamber 336 may be made of non-corrosive material, for example it may be anodized. The degas chamber 336 includes a door to atmosphere 302, a door to vacuum 304, a wafer holder 308, a UV light source 310, an exhaust system 410, a pressure sensor 414, a vent 316, and a gas injector 408.

Figure 6:
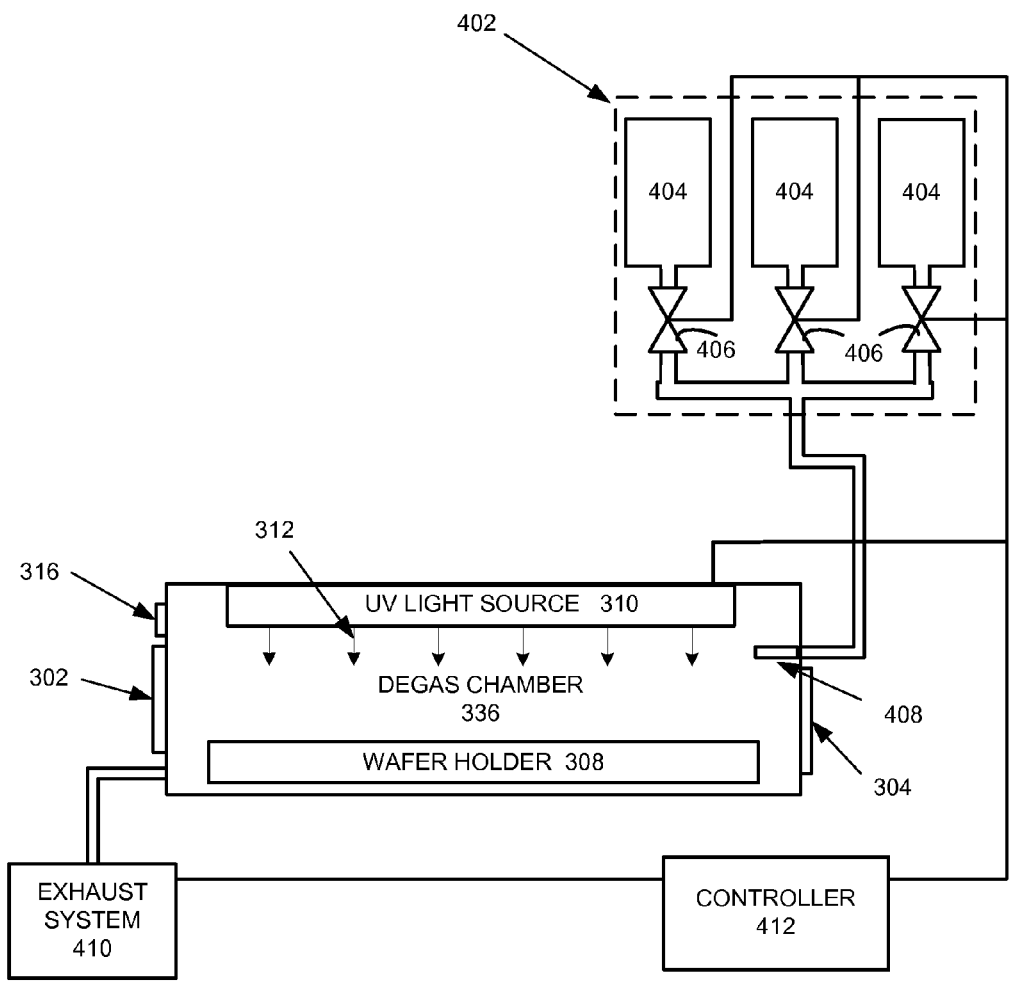
FIG. 6 is a schematic view of another embodiment of a degas chamber and related components.

FIGS. 3 and 4 show the UV light source 310 located outside the degas chamber 336. In this embodiment, the degas chamber 336 includes a window 314 through which the UV light 312 from the UV light source 310 shines onto the processed wafer held below in the wafer holder 308. An alternative embodiment is shown in FIG. 6 where the UV light source 310 is located inside the degas chamber 336. Regardless of its location inside or outside the degas chamber 336, the UV light source 310 is preferably located no more than about 30 cm from the wafer being treated. More preferably, the UV light source 310 is located as close as possible to the wafer being treated.

The gas injector 408 injects gas into the degas chamber 336. The gas is provided by the gas source 402. An exemplary gas source 402 may include a number of individual gas tanks 404 for holding the different gases provided, an oxygen tank 416, a water vapor source 405, and an ozone generator 418. The gas source 402 also includes a control valve 406 for each of the individual gas tanks 404 and the water vapor source 405. There is also an oxygen control valve 420 and an ozone control valve 422. While FIG. 4 shows an individual gas tank 404, a water vapor source 405, and the oxygen tank 416, there may be a different number of gas tanks/sources 404, as required for holding the different number of individual gases. For example, the injected gas may contain a mixture of ozone and oxygen and therefore there would be at least the oxygen tank 416 for holding oxygen and the ozone generator 418 for converting a portion of the oxygen to ozone. However, if the gas also contained nitrogen, for example, there would be a gas tank 404 for holding the nitrogen.

An alternative embodiment of a gas source 402 is shown in FIG. 6. In this embodiment, there is no ozone generator 418. When there is no ozone generator 418, the ozone may be generated within the degas chamber by the application of specific UV light 312 from the UV light source 310. Typically, a wavelength of less than 200 nm may be used to generate ozone from oxygen. While FIG. 4 shows one embodiment of the gas source 402 together with one embodiment of the degas chamber 336 and FIG. 6 shows a different embodiment of the gas source 402 together with a different embodiment of the degas chamber 336, these parts may be interchanged. Thus the gas source 402 of FIG. 4 may be used with the degas chamber 336 of FIG. 6, and the gas source 402 of FIG. 6 may be used with the degas chamber 336 of FIG. 4. A water vapor source may be provided in some embodiments of the invention.

An example of a suitable gas injector 408 is a five-finger injector which has five individual injector nozzles spread out and aimed apart from one another in order to aim the injected gas to have an evenly spread flow. The gas injector 408 and the exhaust system 410 need to be located in a manner that allows the gas to come in the gas injector 408, flow over the wafer and then be pulled out of the degas chamber 336 by the exhaust system 410. For example, the embodiment shown in FIG. 4 shows the gas injector 408 at the top of one side of the degas chamber 336 and the exhaust system 410 located at the bottom of the opposite side. A suitable exhaust system 410 may include ducting and a dedicated air pump, for example. In another embodiment, the exhaust system 410 may just comprise ducting, which leads to a non-dedicated air pump.

A controller 412 is shown connected to the pressure sensor 414, the exhaust system 410, the UV light source 310, the control valves 406, the oxygen control valve 420 and the ozone control valve 422. However the controller may also be connected to and control other components, for example the vent 316, the door to atmosphere 302 and the door to vacuum 304.

Figure 5A:
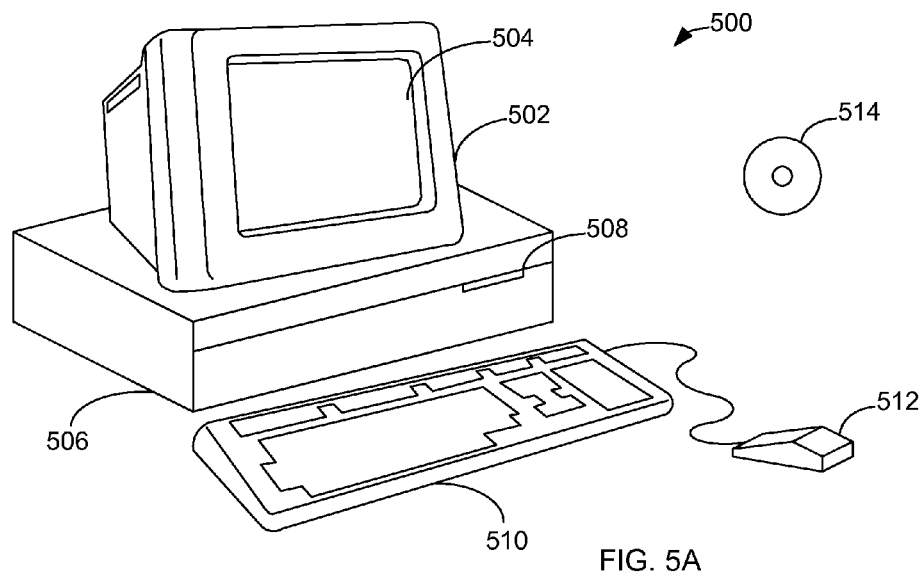
FIG. 5A-B are schematic views of a computer system that may be used in practicing the invention.
Figure 5B:
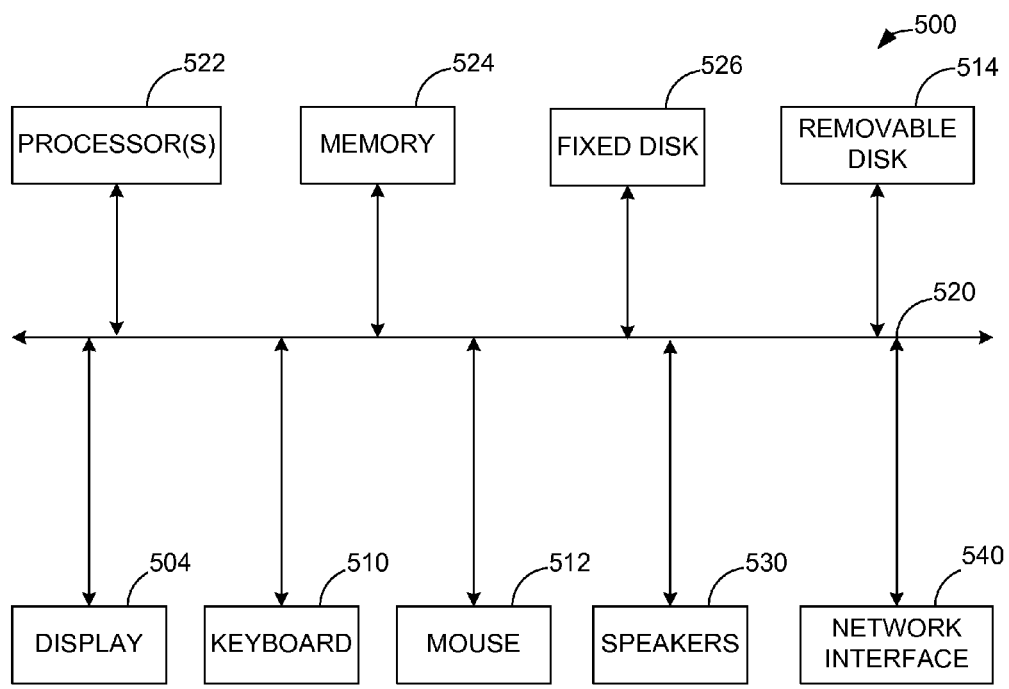

FIGS. 5A and 5B illustrate a computer system 500, which is suitable for implementing a controller 412 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for the computer system 500. Attached to system bus 520 is a wide variety of subsystems. Processor(s) 522 (also referred to as central processing units or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of any of the computer-readable media described below.

CPU 522 is also coupled to a variety of input/output devices, such as display 504, keyboard 510, mouse 512 and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In a more detailed embodiment of the invention, the unprocessed wafer typically starts in a cassette 202. An unprocessed wafer is removed from the cassette 202 (step 102) and transferred to the entrance load lock 334 through the door to atmosphere 318 (step 104). This is shown by a first workflow indicator 330 in FIG. 3. When the procedure starts, the door to vacuum 320 is closed and the door to atmosphere 318 is open. The wafer is then held in the wafer holder 306 and the door to atmosphere 318 is closed and sealed. The evacuation means evacuates the atmosphere in the sealed entrance load lock 334, thus forming a vacuum (step 108). The door to vacuum 320 is now opened and the wafer is transferred out of the entrance load lock 334 and through the VTM 212 into a processing chamber 208 in the processing tool 200 (step 112). In the processing chamber 208, the wafer is processed (step 116). For example, the processing may include the wafer having an etch mask applied, being etched, or having an etch mask stripped. Multiple processing chambers 208 may be used and a single wafer may undergo one or more processes that may require the use of one or more processing chambers.

After processing, the processed wafer is removed from the processing chamber 208 and transferred through the VTM 212 to the degas chamber 336 (step 120). In order to receive a processed wafer from the VTM 212, there must be a vacuum in the degas chamber 336. Therefore, before the degas chamber 336 receives the wafer both doors 302, 304 of the degas chamber must be sealed and then the atmosphere in the degas chamber 336 is evacuated by the exhaust system 410. Once the pressure sensor 414 detects a vacuum in the degas chamber 336, the door to vacuum 304 is opened and the degas chamber 336 is ready to receive a processed wafer. At this point the door to atmosphere 302 of the degas chamber 336 is still sealed and the door to vacuum 304 is open and the wafer is transferred through the open door to vacuum 304 and into the degas chamber 336 (step 120). Once in the degas chamber 336, the wafer is held by the wafer holder 308 and the door to vacuum 304 is closed and sealed. The wafer is now ready to be treated in the degas chamber 336.

The UV light 312 is turned on and the gas injector 408 injects gas into the degas chamber 336 to treat the processed wafer (step 124). In one embodiment, the injected gas contains at least one of ozone or oxygen. The gas may also contain other components such as nitrogen and/or water vapor. An exemplary mixture of the gas is composed of 15 wt. % ozone and 85 wt. % oxygen. The gas preferably contains from approximately 3 wt. % ozone to approximately 30 wt. % ozone. More preferably, the gas contains approximately 5 wt. % ozone to approximately 20 wt. % ozone. The composition of the gas mixture may be set by controlling the control valves 406, oxygen control valve 420 and ozone control valve 422 to allow different flow rates of the required gases. The gas is flowed over the wafer and then out the exhaust system 410.

The wafer is treated with the UV light 312 and gas in the degas chamber 336 for a period of time that allows the halogen residue to be substantially removed from the wafer. Preferably the treatment lasts between 5 seconds and 20 minutes. More preferably the treatment lasts between 10 seconds and 120 seconds. Once the treatment is completed, the gas flow is stopped (step 128). The exhaust system 410 may be left running for a short time to allow the remaining gas to be removed from the degas chamber 336 before the degas chamber 336 is vented. The degas chamber 336 is vented to atmospheric pressure by way of the vent 316 (step 132) and the UV light 312 is stopped (step 136). The pressure sensor 414 coupled with the degas chamber 336 may be used to ensure that the pressure inside the degas chamber 336 matches the pressure outside the degas chamber 336 before the door to atmosphere 302 is opened.

The door to atmosphere 302 is opened and the wafer is removed from the degas chamber 336 through the door to atmosphere 302 (step 140). The wafer may then be moved to an isolation station 210 as shown by a second workflow indicator 328 (step 144). The isolation station 210 may hold the treated wafer for a period of time to allow any remaining residue to dissipate. Preferably, the treated wafer is held in the isolation station for 1 minute to 30 minutes. If the isolation station 210 has an exhaust 322, it may be turned on to help to pull any remaining residue away from the wafers by pumping air from the isolation station 210. Once the wafer is done in the isolation station 210, it is moved back to the cassette 202 as shown by a third workflow indicator 326 (step 148). Alternatively, the wafer may be transferred directly from the degas chamber 336 to the cassette 202 without the need for an isolation station 210 as shown by a fourth workflow indicator 332.

In another embodiment, the degas chamber 336 does not have a door to atmosphere 302. Instead, the wafer is moved back into the VTM and then to the load lock 334.

Specifically, an exemplary degas load lock station includes: a degas chamber, a wafer holder, a pressure sensor, a UV light source, a gas injector, an exhaust system, a vent, vacuum seals and an isolation station.

The addition of a degas load lock station helps to solve the problems created by the contaminating residue, while also avoiding the deficiencies inherent in the downstream stripper. By adding a degas load lock station that does not take a valuable spot in the processing tool, the processing tool is capable of hosting another processing chamber and thus increasing the overall throughput of the processing tool while also helping to remove the contaminating residue. Additionally, the degas load lock station and the method of using it do not require the high temperatures needed in the downstream stripper. With the addition of the degas load lock station, the unprocessed wafers entering the processing tool 200 and the processed wafers exiting the processing tool 200 can travel different paths. The incoming unprocessed wafer travels through the entrance load lock 334 and the outgoing processed wafer travels through the degas chamber 336. Therefore, the processed wafer having the contaminating residue does not come in close proximity with an unprocessed wafer, for example in a single two-way airlock that would transfer both incoming and outgoing wafers. Additionally, the processed wafers cannot contaminate the entrance load lock 334 itself since they do not travel through the entrance load lock 334. This helps to prevent cross contamination between the processed wafers and the unprocessed wafers.

Figure 7:
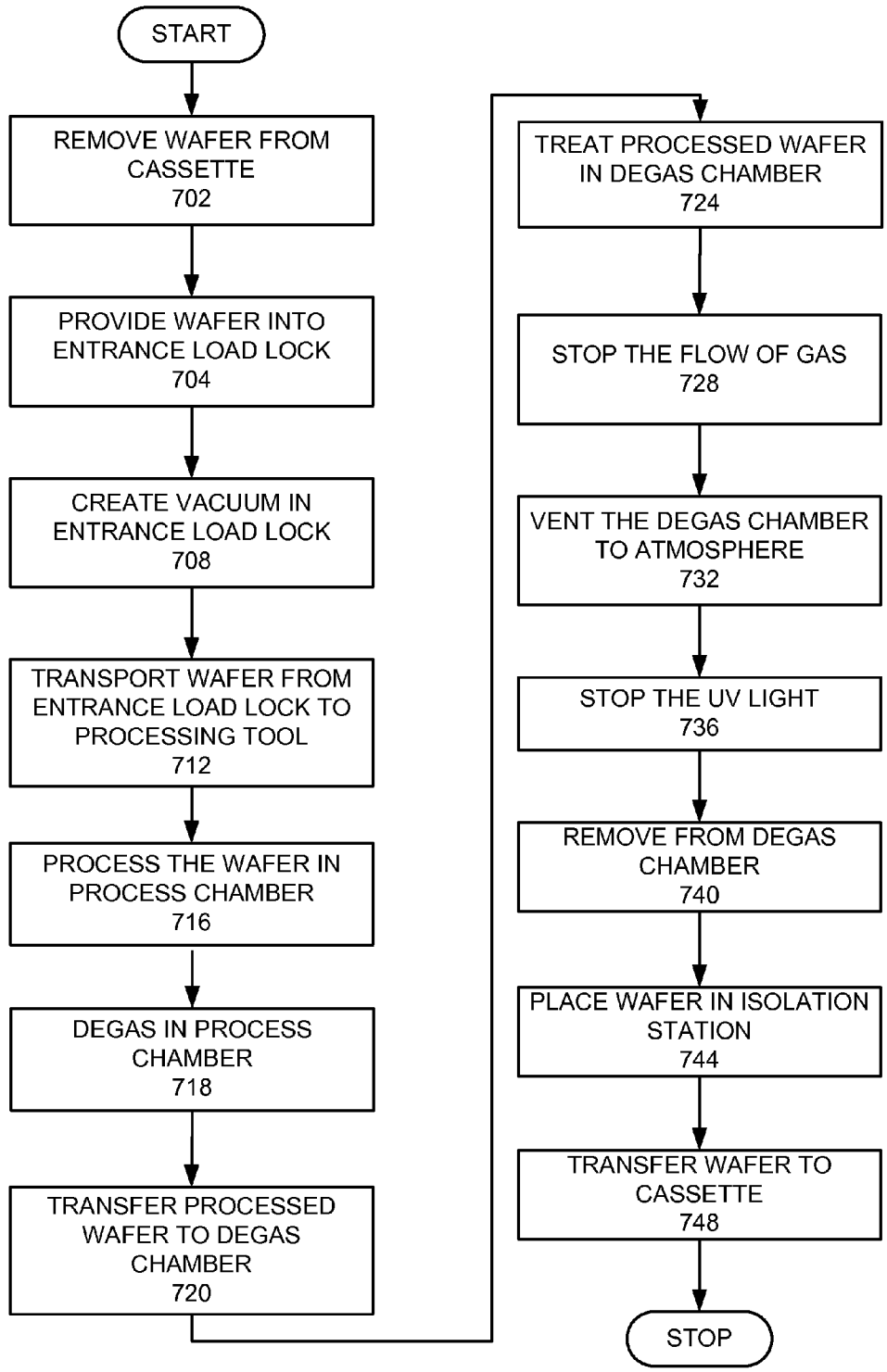
FIG. 7 is a high level flow chart of another embodiment of the invention.

FIG. 7 is a high level flow chart of another embodiment of the invention. An unprocessed wafer typically starts outside of the processing tool in normal atmosphere in a cassette that may hold a plurality of wafers. In order to be processed, it must be moved into the vacuum of the processing tool. In this embodiment, the wafer is removed from the cassette (step 702) and moved into an entrance load lock (step 704). The entrance load lock is closed and a vacuum is formed in the entrance load lock (step 708). Once the vacuum has been established in the entrance load lock, the door to the vacuum of the processing tool is opened and the wafer is transferred from the entrance load lock to a processing tool (step 712) where the wafer is processed in a processing chamber (step 716). The processing may include having an etch mask applied, being etched or stripping an etch mask, for example. The processing may actually include multiple processes that may require the use of one or multiple processing chambers within the processing tool. In a processing chamber where the last process is performed, a subsequent degas process is performed (step 718). The processed wafer is now transferred into the degas chamber (step 720). The degas chamber is then sealed and now contains a vacuum. The wafer is treated with UV light and a gas mixture to remove the halide residue (step 724). The gas mixture comprises at least one of ozone, $H_2O$, or oxygen. While the gas mixture is flowing over the processed wafer, it is also being pumped out of the degas chamber. After the prescribed treatment time, the flow of gas is stopped (step 728), the degas chamber is vented to atmosphere (step 732) and the UV light is stopped (step 736). Once the pressure in the degas chamber has equalized with the atmosphere outside the degas chamber, the treated wafer is removed from the degas chamber (step 740). The treated wafer may then be placed in the isolation station (step 744) for a period of time to allow any remaining residue to dissipate. The treated wafer may then be transferred to a cassette (step 748).

Figure 8A:
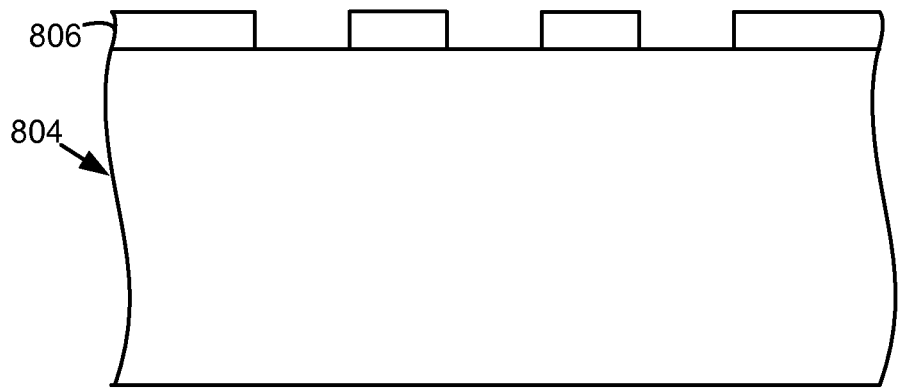
FIG. 8A-C are cross-sectional views of a wafer processed according to an embodiment of the invention.

In a more detailed embodiment of the invention, the unprocessed wafer typically starts in a cassette 202. FIG. 8A is a cross-sectional view of an unprocessed wafer 804 under a photoresist mask 806. The unprocessed wafer 804 is removed from the cassette 202 (step 702) and transferred to the entrance load lock 334 through the door to atmosphere 318 (step 704). This is shown by a first workflow indicator 330 in FIG. 3. When the procedure starts, the door to vacuum 320 is closed and the door to atmosphere 318 is open. The wafer is then held in the wafer holder 306 and the door to atmosphere 318 is closed and sealed. The atmosphere in the sealed entrance load lock 334 is evacuated, thus forming a vacuum (step 708). The door to vacuum 320 is now opened and the wafer is transferred out of the entrance load lock 334 and through the VTM 212 into a processing chamber 208 in the processing tool 200 (step 712).

Figure 8B:
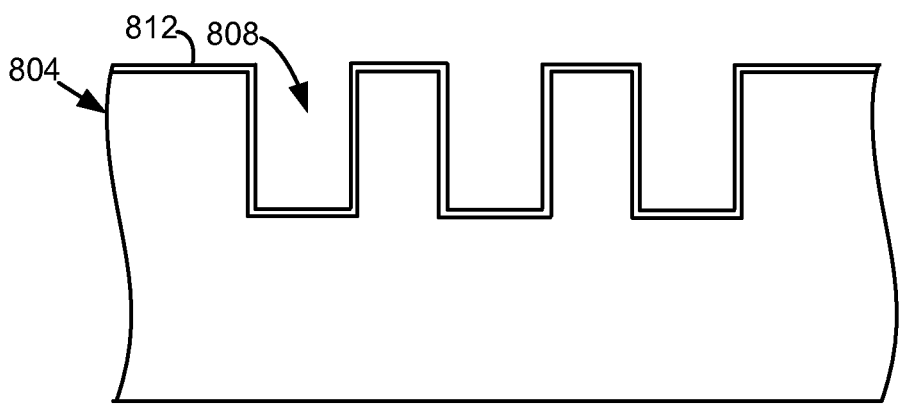
Figure 9:
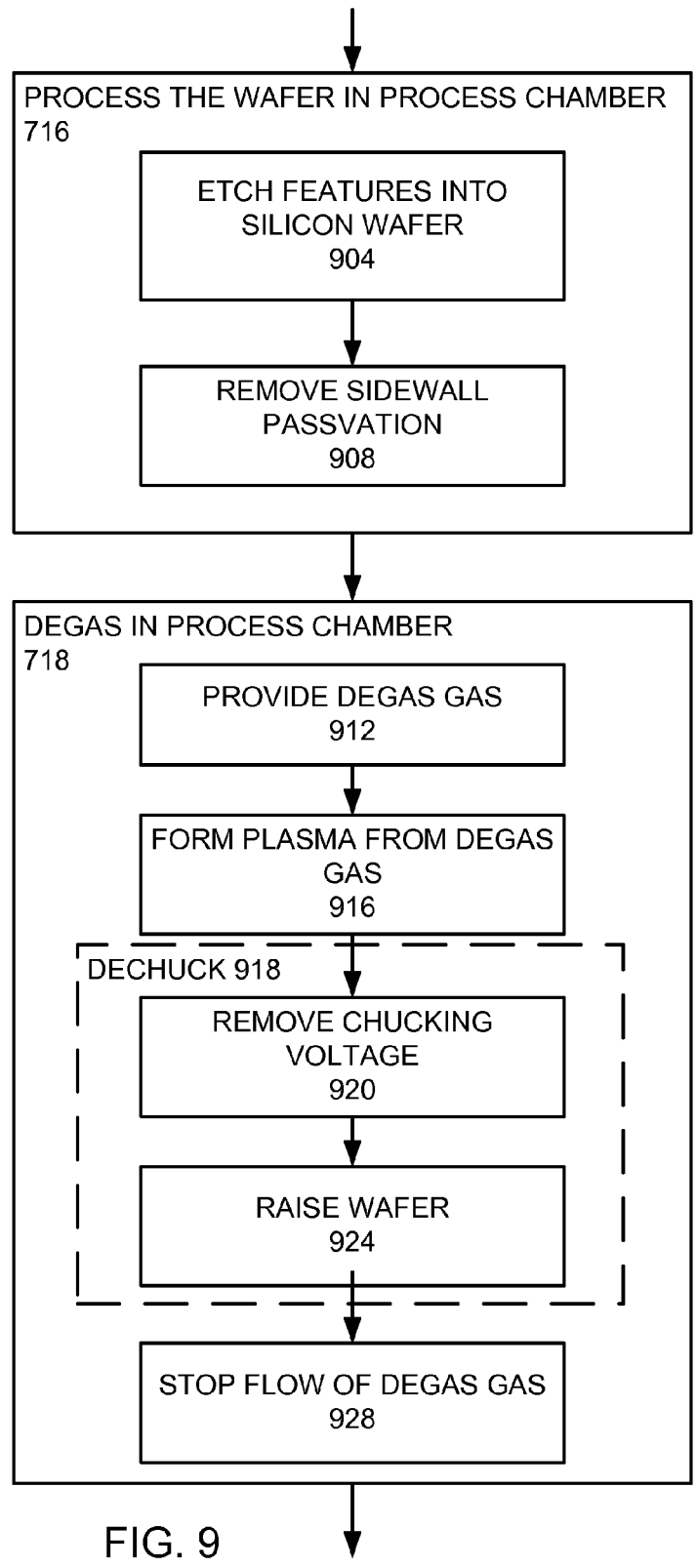
FIG. 9 is a more detailed flow chart of the process the wafer in process chamber step and the in-situ degas step.

In the processing chamber 208, the wafer is processed (step 716). Multiple processing chambers 208 may be used and a single wafer may undergo one or more processes that may require the use of one or more processing chambers. FIG. 9 is a more detailed flow chart of the process the wafer in process chamber step (step 716) used in an example of an embodiment of the invention. In this example, the silicon wafer is etched forming a silicon oxide sidewall passivation over the etch features (step 904). FIG. 8B is a cross-sectional view of the wafer 804 after features 808 have been etched into the wafer, forming silicon oxide sidewall passivation 812.

The silicon oxide sidewall passivation 812 is formed to provide an improved etch. For example, the sidewall passivation may reduce undercutting or other undesirable results. In the prior art, a wet process may be used to remove silicon oxide sidewall passivation. Such a process would require that the wafer be removed from the load lock chamber, which requires extra time and extra steps, which increases costs and slows processing. One advantage a wet process had over removing the silicon oxide sidewall with a plasma etch, is that such a plasma etch would leave a fluorine residue, which could degrade device performance. Therefore, in this example a dry etch is used to remove the silicon oxide sidewall, and a combination of degas steps are used to remove the fluorine residue and other halogen residues from the etch process.

Figure 8C:
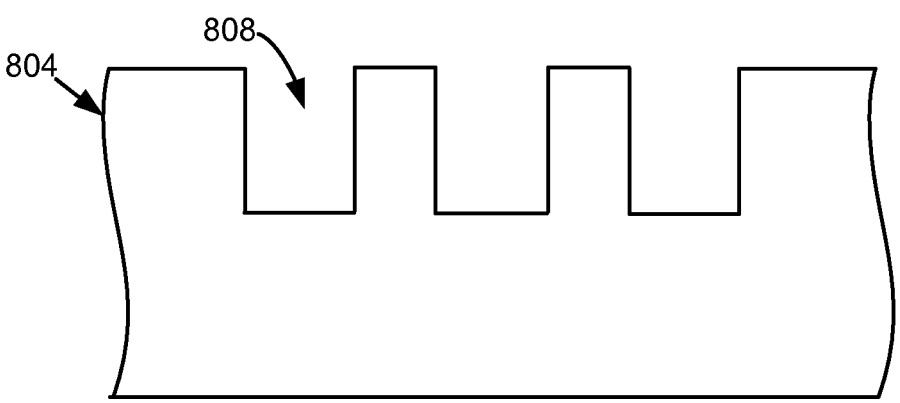

In this example, a fluorine containing wafer process, such as a fluorine containing etch, is used to provide a plasma etch, which removes the silicon oxide sidewall passivation (step 908). Such a fluorine etch may use a fluorine containing gas, such as $C_2F_6$, $CF_4$, $CHF_3$, $CH_2F_2$, $SF_6$, or $NF_3$, which may be used with a diluent of He, Ar, Ne, Xe, or Kr, and an additive of $O_2$. In an example recipe, a pressure of 5-100 mTorr is provided. 50-500 sccm $CF_4$ is flowed into the etching chamber. TCP is provided at 200-1000 watts at 13.56 MHz. No bias voltage is provided, so that the silicon oxide sidewall is removed, without over etching other material. A plasma formed from the $CF_4$ is maintained for 5 to 30 seconds. FIG. 8C is a cross sectional view of the silicon wafer 804 after the silicon oxide sidewall passivation has been removed.

After processing the wafer, an in-situ degas process is provided in the etch chamber (step 718). A degas gas is flowed into the process chamber (step 912). Preferably, the degas provides a flow of $O_2$ that is at least 5% of the total gas flow during the degas process. More preferably, the flow of $O_2$ is at least 50% of the total gas flow during the degas process. Most preferably, the flow of $O_2$ is at least 70% of the total gas flow during the degas process. Preferably, a flow of $N_2$ is provided with a flow rate of between 0-50% of the flow of $O_2$ is provided. More preferably, the flow of $N_2$ is 10-20% of the flow of $O_2$. The degas gas is formed into a plasma (step 916). An example recipe of a degas process provides a pressure of 5-500 mTorr. A flow of 50-2000 sccm $O_2$ and 0-400 sccn $N_2$ is provided to the etch chamber. Other additive gases, such as inert gases He, Ar, Ne, and Xe may also be added. 50 to 5000 watts of TCP power is provided at 13.56 MHz to form the in-situ degas gas into a plasma.

In this embodiment, the silicon wafer is dechucked during the degas process (step 918). In this example, during the degas process, the wafer is dechucked by removing a chucking voltage (step 920) and then using lifter pins to raise the silicon wafer from the chuck (step 924). It is believed that raising the wafer during the in-situ degas reduces heat transfer from the wafer to the electrostatic chuck, which increases wafer temperature. Increasing the wafer temperature during the degassing process can further reduce remaining halogens on the wafer.

After the in-situ degas in the process chamber, the processed wafer is removed from the processing chamber 208 and transferred through the VTM 212 to the degas chamber 336 (step 720). In order to receive a processed wafer from the VTM 212, there must be a vacuum in the degas chamber 336. Therefore, before the degas chamber 336 receives the wafer both doors 302, 304 of the degas chamber must be sealed and then the atmosphere in the degas chamber 336 is evacuated by the exhaust system 410. Once the pressure sensor 414 detects a vacuum in the degas chamber 336, the door to vacuum 304 is opened and the degas chamber 336 is ready to receive a processed wafer. At this point the door to atmosphere 302 of the degas chamber 336 is still sealed and the door to vacuum 304 is open and the wafer is transferred through the open door to vacuum 304 and into the degas chamber 336 (step 720). Once in the degas chamber 336, the wafer is held by the wafer holder 308 and the door to vacuum 304 is closed and sealed. The wafer is now ready to be treated in the degas chamber 336.

The UV light 312 is turned on and the gas injector 408 injects gas into the degas chamber 336 to treat the processed wafer (step 724). In one embodiment, the injected gas contains at least one of ozone, oxygen, or $H_2O$. In one example, the injected gas flow rate is between 0.3 to 5 slm (standard liters per minute) and consists of 20-100% water vapor with the remainder of the injected gas being $O_2$. The pressure is maintained between 100 mT and 5 Torr. The gas may also contain other components such as nitrogen. Another exemplary mixture of the gas is composed of 15 wt. % ozone and 85 wt. % oxygen. The gas preferably contains from approximately 3 wt. % ozone to approximately 30 wt. % ozone. More preferably, the gas contains approximately 5 wt. % ozone to approximately 20 wt. % ozone. The composition of the gas mixture may be set by controlling the control valves 406, oxygen control valve 420 and ozone control valve 422 to allow different flow rates of the required gases. The gas is flowed over the wafer and then out the exhaust system 410.

The wafer is treated with the UV light 312 and gas in the degas chamber 336 for a period of time that allows the halogen residue to be substantially removed from the wafer. Preferably the treatment lasts between 5 seconds and 20 minutes. More preferably the treatment lasts between 10 seconds and 120 seconds. Once the treatment is completed, the gas flow is stopped (step 728). The exhaust system 410 may be left running for a short time to allow the remaining gas to be removed from the degas chamber 336 before the degas chamber 336 is vented. The degas chamber 336 is vented to atmospheric pressure by way of the vent 316 (step 732) and the UV light 312 is stopped (step 736). The pressure sensor 414 coupled with the degas chamber 336 may be used to ensure that the pressure inside the degas chamber 336 matches the pressure outside the degas chamber 336 before the door to atmosphere 302 is opened.

The door to atmosphere 302 is opened and the wafer is removed from the degas chamber 336 through the door to atmosphere 302 (step 740). The wafer may then be moved to an isolation station 210 as shown by a second workflow indicator 328 (step 744). The isolation station 210 may hold the treated wafer for a period of time to allow any remaining residue to dissipate. Preferably, the treated wafer is held in the isolation station for 1 minute to 30 minutes. If the isolation station 210 has an exhaust 322, it may be turned on to help to pull any remaining residue away from the wafers by pumping air from the isolation station 210. Once the wafer is done in the isolation station 210, it is moved back to the cassette 202 as shown by a third workflow indicator 326 (step 748). Alternatively, the wafer may be transferred directly from the degas chamber 336 to the cassette 202 without the need for an isolation station 210 as shown by a fourth workflow indicator 332.

Experiments using only a UV and oxygen or ozone degassing after the wafer is removed from the process chamber have found that 60-80% of Br is removed from a wafer etched with recipes that include HBr. If a higher degree of Br removal is desirable to further improve the margin against defects due to condensation formed by reactions between Br and moisture in air, and to prevent corrosion from HBr outgassing from etched wafers into atmospheric section of the etch tool, experiments have found that an in-situ wafer dehalogenation with an $O_2$-rich plasma followed by an ex-situ dehalogenation in a UV+$O_3$ station allows removal of >90% of Br on wafers etched with HBr rich chemistries. It is believed that higher halogen reduction is achieved due to sequential reduction of residual halogen in the main chamber.

In addition, experiments indicate that an in-situ wafer dehalogenation with an $O_2$-rich plasma can enable the use of other chemistries in the degas station, such as UV+$H_2O$.

It has been found that the in-situ degas process also allows for removal of carbon-containing deposits. Therefore the combination of the in-situ degas with an ex-situ degas is able to meet dehalogenation requirements and carbon residue requirements.

In other embodiments of the invention one or more layers may be placed between the silicon wafer and the mask. Some of these one or more layers may be etched during the etching processes. In one embodiment these one or more layers are etched instead of the silicon wafer. Preferably, these layers may be one of polysilicon, TiN, W, $SiO_2$, TiAlN, $WSi_x$, TaN, Ti, $TiO_2$, $Al_2O_3$, or $ZrO_2$.

An advantage of the invention is that sufficient dehalogenation may be performed without heating the wafer to a temperature above 200° C. Heating the wafer to temperatures above 200° C., may damage device performance. Therefore, a preferred embodiment of the invention maintains the wafer temperature below 200° C. during the dehalogenation process.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method comprising:
providing a wafer into an entrance load lock chamber;
creating a vacuum in the entrance load lock chamber;
transporting the wafer from the entrance load lock chamber to a processing tool;
processing the wafer in a process chamber in the processing tool to provide a processed wafer, wherein the processing forms halogen residue on the wafer;
providing a degas step to the wafer in the process chamber after processing the wafer;
transferring the processed wafer into a degas chamber, wherein a vacuum is maintained in the degas chamber;
treating the processed wafer in the degas chamber with UV light and a flow of gas comprising at least one of ozone, oxygen, or $H_2O$;
stopping the flow of gas;
stopping the UV light; and
removing the processed wafer from the degas chamber.

2. The method, as recited in claim 1, wherein the providing a degas step to the wafer in the process chamber, comprises:
providing a halogen free gas of at least 5% oxygen; and
forming a plasma from the gas of at least 5% oxygen.

3. The method, as recited in claim 2, further comprising dechucking the wafer in the process chamber, wherein the providing a degas step is concurrent with the dechucking the wafer.

4. The method, as recited in claim 3, wherein the dechucking the wafer, comprises lifting the wafer in the process chamber in the presence of the plasma from the gas of at least 5% oxygen.

5. The method, as recited in claim 4, wherein the halogen free gas further comprises nitrogen, wherein a flow rate of the nitrogen is between 10% to 20% of a flow rate of the oxygen.

6. The method, as recited in claim 5, wherein the degas step removes carbon residues.

7. The method, as recited in claim 5, wherein the halogen free gas is at least 50% oxygen.

8. The method, as recited in claim 5, wherein the halogen free gas is at least 70% oxygen.

9. The method, as recited in claim 2, wherein the halogen free gas further comprises nitrogen, wherein a flow rate of the nitrogen is between 10% to 20% of a flow rate of the oxygen.

10. The method, as recited in claim 9, wherein the halogen free gas is at least 50% oxygen.

11. The method, as recited in claim 2, wherein the halogen free gas is at least 70% oxygen.

12. The method, as recited in claim 11, wherein the halogen free gas further comprises nitrogen, wherein a flow rate of the nitrogen is between 10% to 20% of a flow rate of the oxygen.

13. A method, comprising:
providing a wafer into an entrance load lock chamber;
creating a vacuum in the entrance load lock chamber;
transporting the wafer from the entrance load lock chamber to a processing tool;

processing the wafer in a process chamber in the processing tool to provide a processed wafer, wherein the processing forms halogen residue on the wafer;

transferring the processed wafer into a degas chamber;

treating the processed wafer in the degas chamber with UV light and a flow of gas comprising at least one of ozone, oxygen, or $H_2O$;

stopping the flow of gas;

stopping the UV light; and removing the processed wafer from the degas chamber.

14. The method, as recited in claim 13, further comprising transferring the processed wafer to an isolation station after removal from the degas chamber, wherein the isolation station holds a plurality of processed wafers.

15. The method, as recited in claim 14, further comprising pumping out the flow of gas.

16. A method for processing a silicon wafer, comprising:

providing the silicon wafer into an entrance load lock chamber;

creating a vacuum in the entrance load lock chamber;

transporting the wafer from the entrance load lock chamber to a processing tool;

performing an etch of the wafer;

performing a fluorine containing wafer process, which leaves a halogen residue on the wafer;

providing a degas step to the wafer in the process chamber, wherein the degas step removes at least some of the halogen residue, wherein the providing a degas step to the wafer in the process chamber, comprises:

providing a halogen free gas of at least 5% oxygen; and forming a plasma from the gas of at least 5% oxygen;

transferring the wafer into a degas chamber, wherein a vacuum is maintained in the degas chamber;

treating the processed wafer in the degas chamber with UV light and a flow of gas comprising at least one of ozone, oxygen, or $H_2O$;

stopping the flow of gas;

stopping the UV light; and removing the processed wafer from the degas chamber.

17. The method, as recited in claim 16, further comprising forming silicon features in the wafer, wherein the silicon features have a silicon oxide sidewall passivation, wherein the performing the fluorine containing process removes the silicon oxide sidewall passivation.

18. The method, as recited in claim 17, wherein the silicon features are etched into the silicon wafer.

19. The method, as recited in claim 16, wherein the silicon wafer comprises one or more layer over the wafer, wherein the performing an etch of the wafer, comprises etching one or more layers over the wafer.

20. The method, as recited in claim 19, wherein the one or more layers comprises at least one layer of polysilicon, $SiO_2$, SiN, W, TiN, TiAlN, $WSi_x$, TaN, Ti, $TiO_2$, $Al_2O_3$, or $ZrO_2$.

* * * * *